(12) United States Patent
Choi et al.

(10) Patent No.: US 8,921,852 B2
(45) Date of Patent: Dec. 30, 2014

(54) THIN FILM TRANSISTOR ARRAY PANEL AND METHOD OF MANUFACTURING THE SAME

(71) Applicant: Samsung Display Co., Ltd., Yongin, Gyeonggi-Do (KR)

(72) Inventors: Shin Il Choi, Hwaseong-si (KR); Sang Gab Kim, Seoul (KR); Hyang-Shik Kong, Seongnam-si (KR); Su Bin Bae, Gyeongsan-si (KR); Yu-Gwang Jeong, Anyang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/915,342

(22) Filed: Jun. 11, 2013

(65) Prior Publication Data

US 2014/0175424 A1 Jun. 26, 2014

(30) Foreign Application Priority Data

Dec. 24, 2012 (KR) .......................... 10-2012-0152153

(51) Int. Cl.
*H01L 29/417* (2006.01)
*H01L 29/786* (2006.01)
*H01L 29/12* (2006.01)
*H01L 21/77* (2006.01)

(52) U.S. Cl.
CPC ..................................... *H01L 21/77* (2013.01)
USPC ........................ 257/43; 257/E29.117; 438/34

(58) Field of Classification Search
None
See application file for complete search history.

(56) References Cited

U.S. PATENT DOCUMENTS

| | | | | |
|---|---|---|---|---|
| 2010/0006842 A1* | 1/2010 | Fujita et al. | ..................... | 257/59 |
| 2010/0117078 A1* | 5/2010 | Kuwabara et al. | .............. | 257/43 |
| 2011/0227060 A1* | 9/2011 | Miyanaga et al. | .............. | 257/43 |
| 2012/0208310 A1* | 8/2012 | Kim et al. | ........................ | 438/34 |
| 2012/0319112 A1* | 12/2012 | Cho et al. | ........................ | 257/57 |
| 2013/0092923 A1* | 4/2013 | Hara et al. | ....................... | 257/43 |
| 2013/0099240 A1* | 4/2013 | Lee et al. | ........................ | 257/59 |
| 2013/0277666 A1 | 10/2013 | Choi et al. | | |

* cited by examiner

*Primary Examiner* — Thomas L Dickey
*Assistant Examiner* — Joseph Schoenholtz
(74) *Attorney, Agent, or Firm* — Innovation Counsel LLP

(57) ABSTRACT

A thin film transistor array panel includes: a substrate, a gate line positioned on the substrate and including a gate electrode, a semiconductor layer positioned on the substrate and including an oxide semiconductor, a data wire layer positioned on the substrate and including a data line crossing the gate line, a source electrode connected to the data line, and a drain electrode facing the source electrode, and a capping layer covering the data wire layer, in which an end of the capping layer is inwardly recessed as compared to an end of the data wire layer.

20 Claims, 11 Drawing Sheets

THIN FILM TRANSISTOR ARRAY PANEL AND METHOD OF MANUFACTURING THE SAME

CROSS-REFERENCE TO RELATED APPLICATION

This application claims priority to and the benefit of Korean Patent Application No. 10-2012-0152153 filed in the Korean Intellectual Property Office on Dec. 24, 2012, the entire contents of which are incorporated herein by reference.

BACKGROUND (a) Technical Field

The present invention relates to a thin film transistor array panel and a method of manufacturing the same.

(b) Description of the Related Art

In general, flat panel displays such as liquid crystal displays or organic light emitting displays include a plurality of pairs of field generating electrodes and an electro-optical active layer interposed therebetween. In the case of liquid crystal displays, a liquid crystal layer is included as the electro-optical active layer, and in the case of organic light emitting displays, an organic emission layer is included as the electro-optical active layer.

One of the field generating electrodes of the pair is generally connected to a switching element and receives an electric signal, and an image is displayed by converting the electric signal to an optical signal by the electro-optical active layer.

In flat panel displays, a thin film transistor (TFT) that is a three terminal element is used as a switching element, and signal lines, such as a gate line transmitting a scanning signal for controlling the thin film transistor and a data line transmitting a signal to be applied to a pixel electrode, are used.

As the area displaying the image in display devices is increased, oxide semiconductor technology has been studied as a method that allows high-speed driving. Additionally, a method of reducing resistance in the signal lines has also been studied. Particularly, a main wiring layer may be formed of copper, a copper alloy, molybdenum, a molybdenum alloy, or the like in order to reduce the resistance of the signal lines. There is a problem, however, in that the characteristics of the thin film transistor that uses such wiring can deteriorate due to a reaction between the main wiring layer formed of metal and other layers in a process, and the like. For example, when a passivation layer including silicon oxide is formed after the main wiring layer is formed, charge mobility may be reduced due to oxidation of the main wiring layer material.

In order to prevent such problems, a capping layer including metal oxide may be formed between the main wiring layer and the passivation layer. But it is difficult to control an etching profile when a capping layer is used due to a difference between the etching speeds of the main wiring layer and the capping layer, and thus the resulting quality of the product may be poor due to problems that may occur during subsequent processing.

The above information disclosed in this Background section is only for enhancement of understanding of the background of the disclosure and therefore it may contain information that does not form the prior art that is already known to a person of ordinary skill in the art.

SUMMARY

A thin film transistor array panel and a method of manufacturing the same can be used to control an etching profile of a main wiring layer and a capping layer, and can prevent deterioration of the thin film transistor array panel characteristics by damage caused in a subsequent process.

A thin film transistor array panel includes: a substrate, a gate line positioned on the substrate and including a gate electrode, a semiconductor layer positioned on the substrate and including an oxide semiconductor, a data wire layer positioned on the substrate and including a data line crossing the gate line, a source electrode connected to the data line, and a drain electrode facing the source electrode, and a capping layer covering the data wire layer, in which an end of the capping layer is inwardly recessed as compared to an end of the data wire layer.

The end of the capping layer and the end of the data wire layer may form a step shape.

The capping layer may include metal oxide.

The capping layer may include metal oxide including at least one of indium, gallium, zinc, and tin.

The capping layer may include indium-zinc oxide.

A channel portion of the semiconductor layer may include a dent portion.

The thin film transistor array panel may further include a passivation layer covering the capping layer, the source electrode, the drain electrode, and a gate insulating layer.

The thin film transistor array panel may further include a barrier layer positioned under the data wire layer, in which the barrier layer may include metal oxide.

A method of manufacturing a thin film transistor array panel includes: forming a gate line including a gate electrode on a substrate, forming a gate insulating layer covering the gate line, forming a semiconductor material layer on the substrate, forming a data wire material layer on the semiconductor material layer, forming a capping material layer on the data wire material layer, forming a first photosensitive film pattern on the capping material layer, the first photosensitive film pattern having a first region and a second region having a thickness that is larger than the thickness of the first region, etching the capping material layer, the data wire material layer, and the semiconductor material layer by using the first photosensitive film pattern as a first mask, performing etchback of the first photosensitive film pattern to form a second photosensitive film pattern, etching the capping material layer and the data wire material layer by using the second photosensitive film pattern as a second mask to form a capping layer and a data wire layer, ashing the second photosensitive film pattern to form a third photosensitive film pattern, and etching the capping layer by using the third photosensitive film pattern as a third mask, in which in the etching of the capping material layer and the data wire material layer by using the second photosensitive film pattern as the second mask, an end of the capping layer includes a projection outwardly protruding from an end of the data wire layer.

In the ashing of the second photosensitive film pattern to form the third photosensitive film pattern, the end of the capping layer may be exposed.

In the etching of the capping layer by using the third photosensitive film pattern as the third mask, the projection of the capping layer may be removed.

After the projection of the capping layer is removed, the end of the capping layer may be inwardly recessed as compared to the end of the data wire layer.

The end of the capping layer may be removed by a dry etching method.

The dry etching method may use gas including argon (Ar).

The capping layer may include metal oxide.

The capping layer may include indium-zinc oxide.

The method may further include removing the third photosensitive film pattern, and forming a passivation layer on the capping layer and the data wire layer.

The method may further include forming a barrier material layer between the semiconductor material layer and the data wire material layer, in which the barrier material layer may include metal oxide.

In the etching of the semiconductor material layer to form the semiconductor layer and the etching of the capping layer by using the third photosensitive film pattern as the third mask, a dent portion may be formed in the semiconductor layer.

The dent portion of the semiconductor layer may be formed in an area corresponding to a channel region.

According to the exemplary embodiments, it is possible to prevent damage from occurring during a subsequent process by removing a projection of metal oxide formed after wet etching when a capping layer including metal oxide is used.

DETAILED DESCRIPTION OF THE EMBODIMENTS

Figure 1:
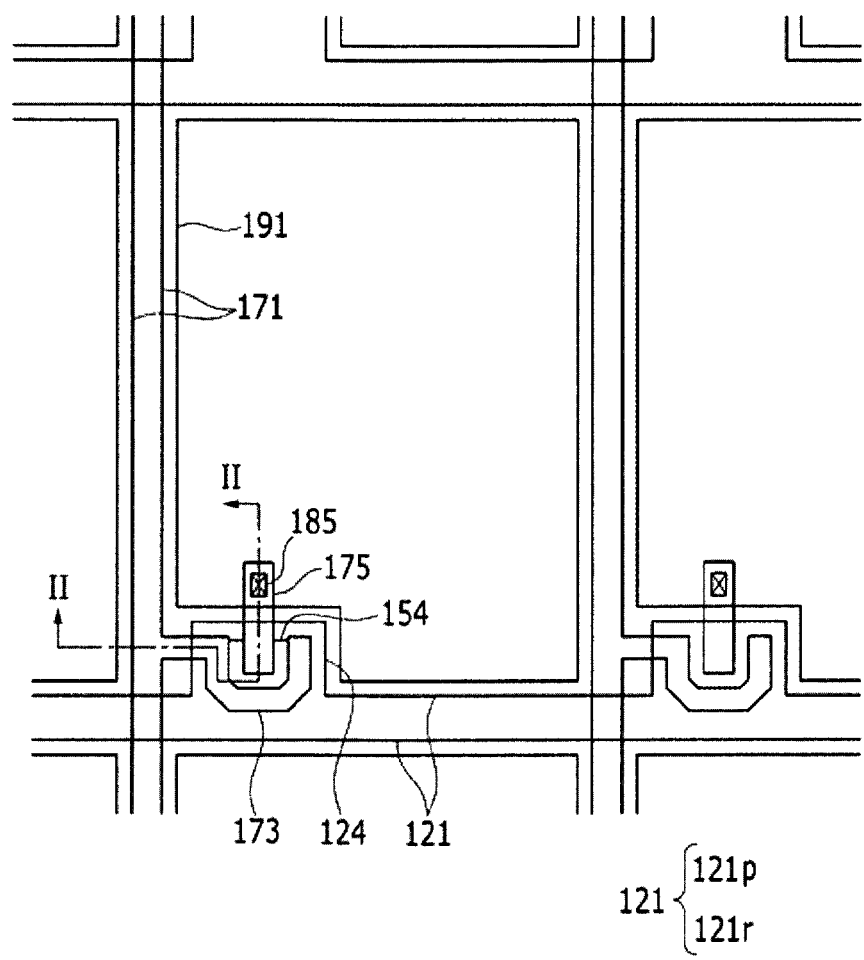
FIG. 1 is a top plan view illustrating a thin film transistor array panel according to an exemplary embodiment.

Hereinafter, exemplary embodiments will be described in detail with reference to the accompanying drawings. As those with ordinary skill in the art would realize, the described embodiments may be modified in various different ways, all without departing from the spirit or scope of the present disclosure. On the contrary, exemplary embodiments introduced herein are provided to sufficiently transfer the spirit of the present disclosure to persons of ordinary skill in the art.

In the drawings, the thickness of layers, films, panels, regions, etc., are exaggerated for clarity. It will be understood that when a layer is referred to as being "on" another layer or substrate, it can be directly on the other layer or substrate, or an intervening layer or substrate may also be present. Like reference numerals designate like elements throughout the specification.

Figure 2:
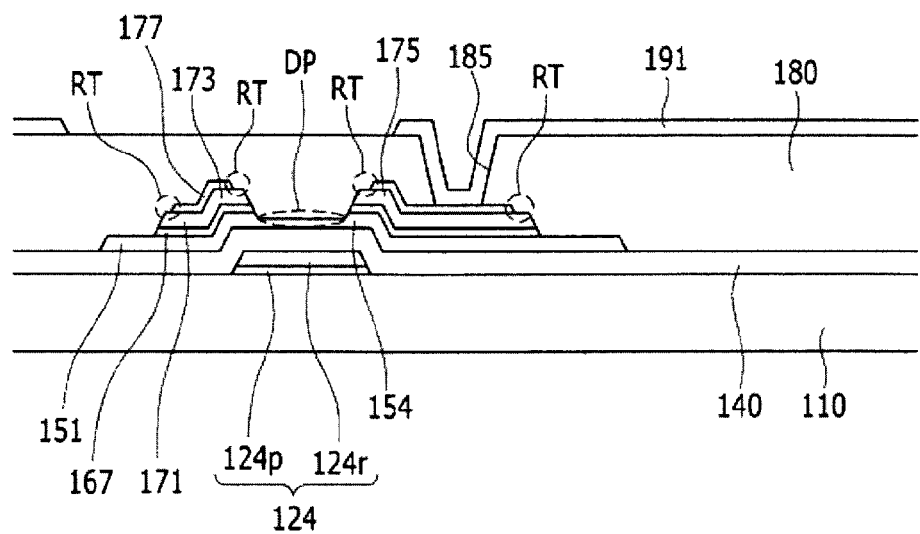
FIG. 2 is a cross-sectional view taken along cut line II-II of FIG. 1.

FIG. 1 is a top plan view illustrating a thin film transistor array panel according to an exemplary embodiment. FIG. 2 is a cross-sectional view taken along cut line II-II of FIG. 1.

Referring to FIG. 1 and FIG. 2, a plurality of gate lines 121 is formed on an insulation substrate 110 made of a transparent glass or plastic.

The gate line 121 transfers a gate signal and mainly extends in a horizontal direction. Each gate line 121 includes a plurality of gate electrodes 124 protruding from the gate line 121.

The gate line 121 and the gate electrode 124 may have a double-layer structure formed of lower layers 121p and 124p and upper layers 121r and 124r. The lower layers 121p and 124p may be formed, for example, of any one of titanium, tantalum, molybdenum, and alloys thereof, and the upper layers 121r and 124r may be formed, for example, of copper (Cu) or a copper alloy. In the present exemplary embodiment, it is described that the gate line 121 and the gate electrode 124 have the double-layer structure, but the gate line 121 and the gate electrode 124 may have a single-layered structure or a triple or more layer structure.

A gate insulating layer 140 formed of an insulating material such as, for example, silicon oxide or silicon nitride is formed on the gate line 121 and the gate electrode 124. In the present exemplary embodiment, it is described that the gate insulating layer 140 has a single layered form, but the gate insulating layer 140 may have a structure, for example, of a lower layer formed of silicon nitride (SiNx) or silicon oxynitride (SiON) and an upper layer formed of silicon oxide ($SiO_2$).

A plurality of semiconductor layers 151 formed of an oxide semiconductor is formed on the gate insulating layer 140. The semiconductor layer 151 mainly extends in a vertical direction under a data line 171, and includes a plurality of projections 154 extending toward the gate electrode 124.

The semiconductor layer 151 includes, for example, at least one of zinc (Zn), indium (In), tin (Sn), gallium (Ga), and hafnium (Hf). Particularly, in the present exemplary embodiment, the semiconductor layer 151 may be, for example, indium-gallium-zinc oxide. In the present exemplary embodiment, a dent portion DP may be formed in the projection 154 of the semiconductor layer 151. The dent portion DP of the semiconductor layer 151 may be formed in a vertical direction and is shallow recess in the semiconductor layer at the channel region.

A barrier layer 167 is positioned on the semiconductor layer 151. The barrier layer 167 includes metal oxide, and may be formed, for example, of indium-zinc oxide, gallium-zinc oxide, aluminum-zinc oxide, and the like. The barrier layer 167 may be omitted.

A data line 171 extending in a vertical direction (FIG. 1), a source electrode 173 connected to the data line 171, and a drain electrode 175 facing the source electrode 173 are positioned on the barrier layer 167.

A data wire layer including the data line 171, the source electrode 173, and the drain electrode 175 may be made of, for example, aluminum-based metal such as aluminum or an aluminum alloy, silver-based metal such as silver or a silver alloy, copper-based metal such as copper or a copper alloy such as copper manganese, molybdenum-based metal such as molybdenum or a molybdenum alloy, chromium, tantalum, or titanium. Further, a data wire layer including the source electrode 173 and the drain electrode 175 may be made of a transparent conductive material such as, for example, ITO, IZO, and AZO. The data line 171, the source electrode 173, and the drain electrode 175 may have a multilayer structure including two or more conductive layers (not illustrated).

The source electrode 173 may be formed to overlap the gate electrode 124 and have an approximately "U" shape. The drain electrode 175 may be formed to face the source electrode 173 with the gate electrode 124 interposed therebetween and extend upwardly from the center of the U shape of the source electrode 173. The structures of the source electrode 173 and the drain electrode 175 are an example, and the shapes thereof may be variously modified.

A capping layer 177 is positioned on the data line 171, the source electrode 173, and the drain electrode 175. In the present exemplary embodiment, the capping layer 177 includes metal oxide, and may be formed of, for example, indium-zinc oxide, gallium-zinc oxide, aluminum-zinc oxide, and the like. The capping layer 177 is formed of metal oxide based on, for example, the copper manganese material, and thus a slope (threshold slope; S.S) value after a threshold voltage is reduced in a voltage-current graph exhibiting a thin film transistor characteristic. Accordingly, the thin film transistor characteristic may be improved.

In the present exemplary embodiment, an end of the capping layer 177 includes a recess portion RT inwardly recessed in a horizontal direction as compared to the end of the data wire layer including the data line 171, the source electrode 173, and the drain electrode 175. In this regard, referring to FIG. 2, the end of the capping layer 177 is recessed from the end of the edge of the data line 171, the source electrode 173, and the drain electrode 175 in a horizontal direction, so that portions of the data line 171, the source electrode 173 and the drain electrode 175 at the respective edges of the data line 171, source electrode 173 and drain electrode 175 are not covered by the capping layer 177. The end of the capping layer 177 and the ends of the data wire layers 171, 173, and 175 may form a step shape due to the aforementioned structure.

Alternatively, the recess portion RT may not be formed on the capping layer 177, and the ends of the horizontal edges of the data wire layers 171, 173, and 175 may coincide with the end of the horizontal edge of the capping layer 177.

The projection 154 of the semiconductor layer 151 has a portion that is not covered by the source electrode 173 and the drain electrode 175, but is exposed between the source electrode 173 and the drain electrode 175. In the present exemplary embodiment, the dent portion DP may be a portion that is not covered by the barrier layer 167, the source electrode 173, and the drain electrode 175, but is exposed.

One gate electrode 124, one source electrode 173, and one drain electrode 175 form one thin film transistor (TFT) together with the semiconductor layer 154, and a channel region of the thin film transistor is formed between the source electrode 173 and the drain electrode 175. In the present exemplary embodiment, the channel region may correspond to the dent portion DP of the semiconductor layer 154.

A passivation layer 180 is positioned on the gate insulating layer 140 to cover the exposed portions of the capping layer 177, the source electrode 173, the drain electrode 175, and the semiconductor layer 154. The passivation layer 180 is made of, for example, an inorganic insulator such as silicon nitride or silicon oxide, an organic insulator, a low dielectric insulator, and the like.

A plurality of contact holes 185 through which the end of the drain electrode 175 is exposed is formed in the passivation layer 180.

A plurality of pixel electrodes 191 is formed on the passivation layer 180. The pixel electrode 191 is physically and electrically connected to the drain electrode 175 through the contact hole 185, and receives a data voltage from the drain electrode 175.

The pixel electrode 191 may be made of a transparent conductor such as, for example, ITO or IZO.

Hereinafter, an exemplary embodiment relating to a method of manufacturing a thin film transistor array panel described in FIGS. 1 and 2 will be described with reference to FIGS. 3 to 11.

FIGS. 3 to 11 are cross-sectional views illustrating a method of manufacturing a thin film transistor array panel according to an exemplary embodiment. FIGS. 3 to 11 illustrate a cross-sectional view taken along cut line II-II of FIG. 1 and are shown according to a process order.

Figure 3:
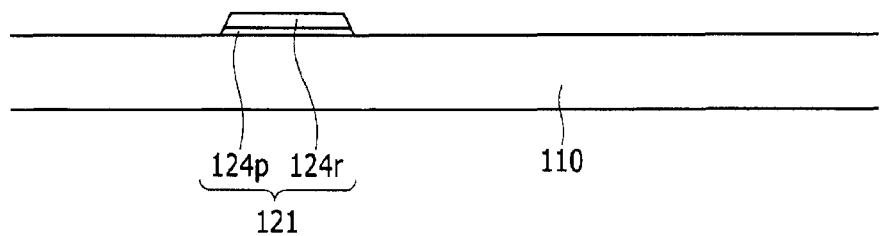
FIGS. 3 to 11 are cross-sectional views illustrating a method of manufacturing a thin film transistor array panel according to another exemplary embodiment.

Referring to FIG. 3, a gate electrode 124 is formed on an insulation substrate 110 made of transparent glass or plastics. The gate electrode 124 may have a double-layer structure formed of a lower layer 124*p* and an upper layer 124*r*; alternatively, the gate electrode 124 may have a single-layered structure or a triple or more layer structure (not shown).

Figure 4:
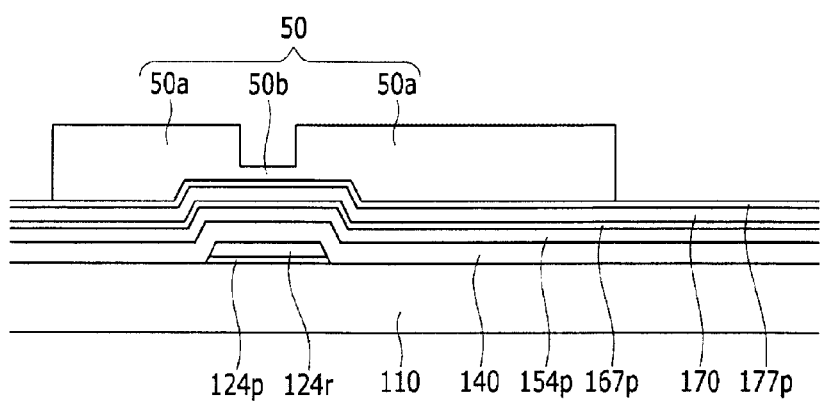

Referring to FIG. 4, a gate insulating layer 140 is formed on the substrate 110 to cover the gate electrode 124, and a semiconductor material layer 154*p*, a barrier material layer 167*p*, a data wire material layer 170, and a capping material layer 177*p* may be sequentially formed on the gate insulating layer 140. Forming the barrier material layer 167*p* may be omitted.

The capping material layer 177*p* includes metal oxide, and may be formed, for example, of indium-zinc oxide, gallium-zinc oxide, aluminum-zinc oxide, and the like. A data wire material layer 170 may be made, for example, of aluminum-based metal such as aluminum or an aluminum alloy, silver-based metal such as silver or a silver alloy, copper-based metal such as copper or a copper alloy such as copper manganese, molybdenum-based metal such as molybdenum or a molybdenum alloy, chromium, tantalum, or titanium. The barrier material layer 167*p* includes metal oxide, and may be formed, for example, of indium-zinc oxide, gallium-zinc oxide, aluminum-zinc oxide, and the like. The semiconductor material layer 154*p* may be formed, for example, of an oxide semiconductor including at least one of zinc (Zn), indium (In), tin (Sn), gallium (Ga), and hafnium (Hf).

Next, a first photosensitive film pattern 50 is formed on the capping material layer 177*p*. The first photosensitive film pattern 50 has a thick first region 50*a* and a relatively thin second region 50*b*. The difference in thickness between the first and second regions 50*a* and 50*b* of the first photosensitive film pattern 50 may be obtained by adjusting the quantity of light radiated using a mask, or by using a reflow method. When the quantity of light is adjusted, a slit pattern, a lattice pattern, or a semi-transparent layer may be formed on the mask. The second region 50*b* having the smaller thickness corresponds to a position at which the channel region of the thin film transistor will be formed.

Figure 5:
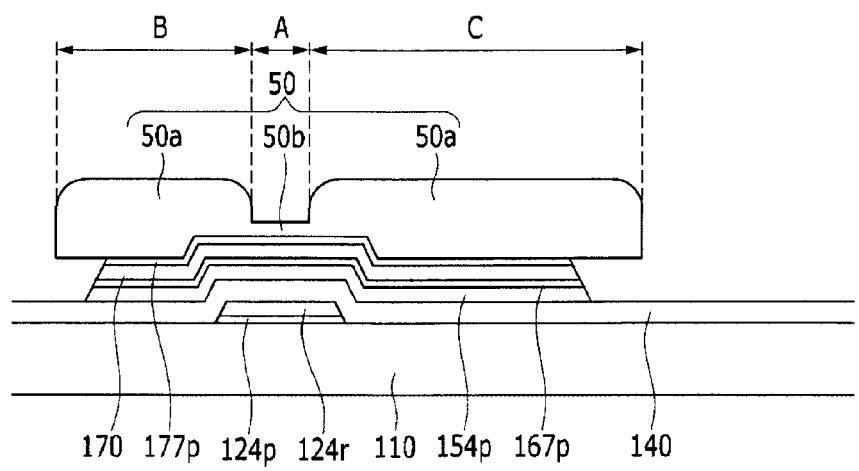

Referring to FIG. 5, the capping material layer 177*p*, the data wire material layer 170, and the barrier material layer 167*p* are wet etched by using an etchant capable of etching the capping material layer 177*p*, the data wire material layer 170, and the barrier material layer 167*p* together by using the first photosensitive film pattern 50 as a mask.

As illustrated in FIG. 5, when the capping material layer 177*p*, the data wire material layer 170, and the barrier material layer 167*p* are etched, lateral surfaces of the capping material layer 177*p*, the data wire material layer 170, and the barrier material layer 167*p* covered by the first photosensitive film pattern 50 are etched by the etchant. As a result, as illustrated in FIG. 5, edges of the capping material layer 177*p*, the data wire material layer 170, and the barrier material layer 167*p* are positioned inside regions A, B, and C where the first photosensitive film pattern 50 is formed.

Figure 6:
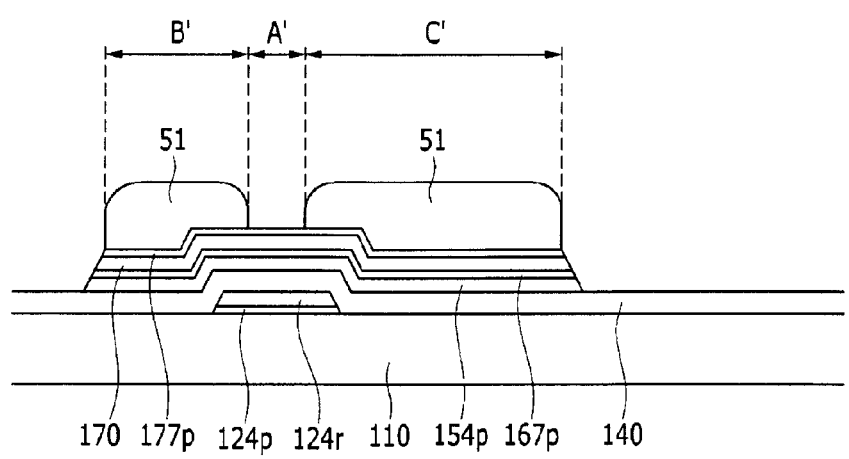

Referring to FIG. 6, the first photosensitive film pattern 50 is subjected to etch back to remove the second region 50*b* having the smaller thickness. In this case, the first region 50*a* is etched to reduce both a width and a height thereof, thus forming a second photosensitive film pattern 51 as illustrated in FIG. 6. The second photosensitive film pattern 51 is formed in regions A', B', and C' that are narrower than the regions A, B, and C where the first photosensitive film pattern 50 was formed, as shown in FIG. 5. An upper surface of the capping material layer 177*p* is exposed through the second photosensitive film pattern 51 in region A', and the exposed upper surface of the capping material layer 177*p* corresponds to a channel region of a semiconductor layer to be subsequently formed.

Figure 7:
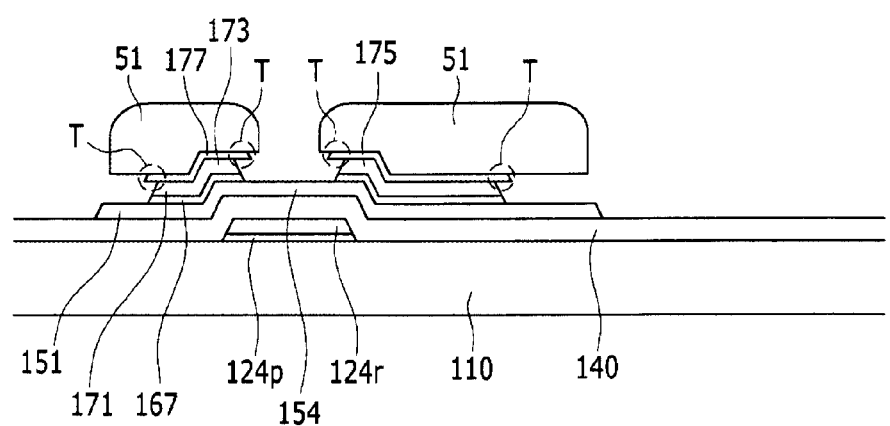

Referring to FIG. 7, the capping material layer 177*p*, and the data wire material layer 170 are wet etched by using the second photosensitive film pattern 51 as a mask to form the capping layer 177 from capping material layer 177*p*, and also the source electrode 173, the drain electrode 175, and data line 171 from wire material layer 170. Because, in this example, an etching speed of the capping material layer 177*p* is slower than the etching speed of the data wire material layer 170, the end of the horizontal edge of the capping layer 177 has a projection T protruding from the end of the horizontal edge of each of the data line 171, the source electrode 173, and the drain electrode 175. The projection T of the capping layer 177 has edges that extend past the edge of the data wire material layer 170 forming the data line 171, the source electrode 173 and the drain electrode 175.

Particularly, because the etching speed of the capping material layer 177p formed of indium-zinc oxide is slower than those of other materials (e.g.: gallium-zinc oxide), the length of the projection T of the capping layer 177 may be more increased.

Figure 8:
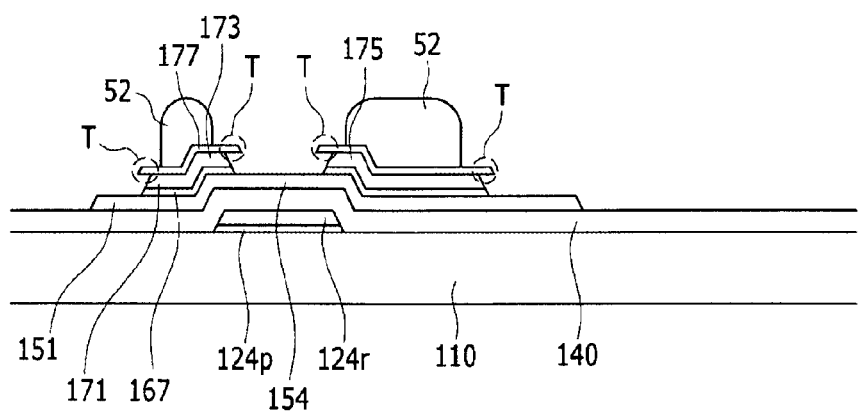

Referring to FIG. 8, a third photosensitive film pattern 52 is formed by ashing the second photosensitive film pattern 51. The width and the height of third photosensitive film pattern 52 are reduced as compared to the second photosensitive film pattern 51, and the projection T of the capping layer 177 is not covered by the third photosensitive film pattern 52, but is exposed.

Figure 9:
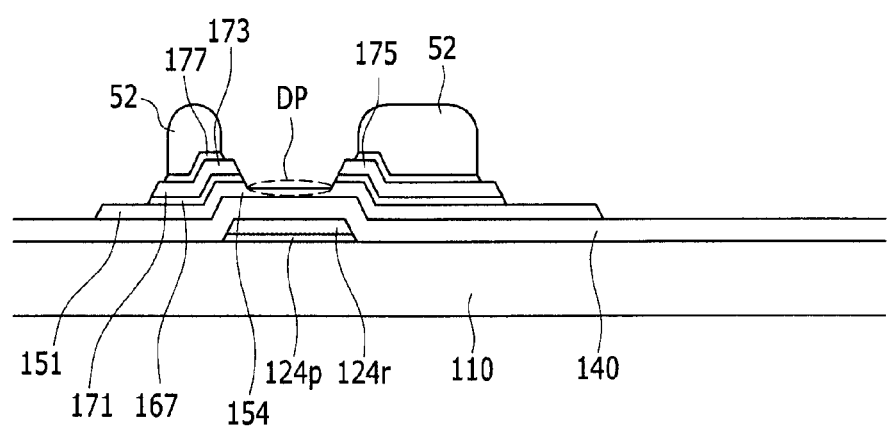

Referring to FIG. 9, the projection T of the capping layer 177 is etched by using the third photosensitive film pattern 52 as a mask. The projection T of the capping layer 177 may be etched by a dry etching method using gas including, for example, argon (Ar) and the like. $NF_3$, $SF_6$, and $CF_4$ gases where fluorine (F) is included in the argon (Ar) gas used in the dry etching method may be added.

In this exemplary embodiment, only the projection T of the capping layer 177 is removed (Case 1) or the end of the capping layer 177 may be inwardly dented, or recessed, at the boundary of the horizontal edge of the data wire layers 171, 173, and 175 including the data line 171, the source electrode 173, and the drain electrode 175 (Case 2) according to a process margin. In the Case 2, portions of the data wire layer 170, particularly at the respective ends of data line 171, the source electrode 173 and the drain electrode 175, are exposed, and are not covered by the capping layer 177. Further, the exposed semiconductor layer 154 may be affected by the dry etching to reduce the thickness thereof, thus forming a dent portion DP in a vertical direction.

According to the present exemplary embodiment, because the projection T of the capping layer 177 is removed, the present exemplary embodiment can prevent a problem of causing cracks in a passivation layer due to poor step coverage during a subsequent process of forming the passivation layer using silicon oxide and the like.

Figure 10:
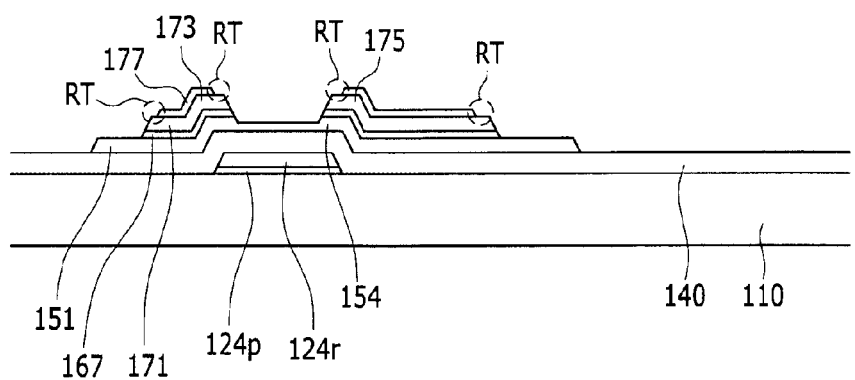

Referring to FIG. 10, the capping layer 177 in which the recess portion RT is formed in a horizontal direction is exposed by removing the third photosensitive film pattern 52. The capping layer 177 is inwardly dented, or recessed, from the boundaries of the horizontal edges of the data wire layers 171, 173, and 175. Alternatively, however, as described above, the end of the capping layer 177 may be formed to coincide with the boundaries of the horizontal edges of the data wire layers 171, 173, and 175 according to the process margin.

Figure 11:
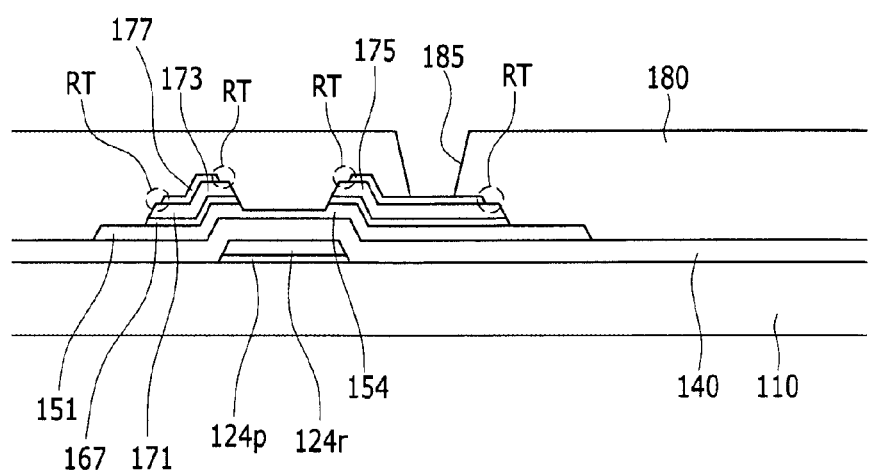

Referring to FIG. 11, a passivation layer 180 is formed on the gate insulating layer 140 to cover the exposed portions of the capping layer 177, the source electrode 173, the drain electrode 175, and the semiconductor layer 154. The passivation layer 180 may be formed, for example, of an inorganic insulator such as silicon nitride or silicon oxide, an organic insulator, a low dielectric insulator, and the like. A contact hole 185 through which an end of the drain electrode 175 is exposed is formed in the passivation layer 180.

A pixel electrode 191 that is physically and electrically connected to the drain electrode 175 through the contact hole 185 may be formed on the passivation layer 180 to form a thin film transistor array panel as illustrated in FIG. 2.

While exemplary embodiments have been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure, including the appended claims.

DESCRIPTION OF SYMBOLS

| 110 | Substrate | 154 | Semiconductor layer |
|-----|-----------|-----|---------------------|
| 167 | Barrier layer | 173 | Source electrode |
| 175 | Drain electrode | 177 | Capping layer |
| RT | Recess portion | | |

What is claimed is:

1. A thin film transistor array panel comprising:
a substrate;
a gate line positioned on the substrate and including a gate electrode;
a semiconductor layer positioned on the substrate and including an oxide semiconductor;
a data wire layer positioned on the substrate and including a data line crossing the gate line, a source electrode connected to the data line, and a drain electrode facing the source electrode; and
a capping layer covering the data wire layer,
wherein an end of the capping layer is inwardly recessed as compared to an end of the data wire,
wherein the data wire layer exposes top surfaces of the source electrode and the drain electrode adjacent to the end of the capping layer, and
wherein the data wire layer extends outwardly from the end of the capping layer.

2. The thin film transistor array panel of claim 1, wherein: the end of the capping layer and the end of the data wire layer form a step shape.

3. The thin film transistor array panel of claim 2, wherein: the capping layer includes metal oxide.

4. The thin film transistor array panel of claim 3, wherein: the capping layer includes metal oxide including at least one of indium, gallium, zinc, and tin.

5. The thin film transistor array panel of claim 4, wherein: the capping layer includes indium-zinc oxide.

6. The thin film transistor array panel of claim 2, wherein: a channel portion of the semiconductor layer includes a dent portion.

7. The thin film transistor array panel of claim 1, further comprising:
a passivation layer covering the capping layer, the source electrode, the drain electrode, and a gate insulating layer.

8. The thin film transistor array panel of claim 1, further comprising:
a barrier layer positioned under the data wire layer,
wherein the barrier layer includes metal oxide.

9. A method of manufacturing a thin film transistor array panel, comprising:
forming a gate line including a gate electrode on a substrate;
forming a gate insulating layer covering the gate line;
forming a semiconductor material layer on the substrate;
forming a data wire material layer on the semiconductor material layer;

forming a capping material layer on the data wire material layer;

forming a first photosensitive film pattern on the capping layer, the first photosensitive film pattern having a first region and a second region having a thickness that is larger than the thickness of the first region;

etching the capping material layer, the data wire material layer, and the semiconductor material layer by using the first photosensitive film pattern as a first mask;

performing etchback of the first photosensitive film pattern to form a second photosensitive film pattern;

etching the capping material layer and the data wire material layer by using the second photosensitive film pattern as a second mask to form a capping layer and a data wire layer;

ashing the second photosensitive film pattern to form a third photosensitive film pattern; and etching the capping layer by using the third photosensitive film pattern as a third mask, wherein in the etching of the capping material layer and the data wire material layer by using the second photosensitive film pattern as the second mask, an end of the capping layer includes a projection outwardly protruding from an end of the data wire layer.

10. The method of claim 9, wherein:
in the ashing of the second photosensitive film pattern to form the third photosensitive film pattern, the end of the capping layer is exposed.

11. The method of claim 10, wherein:
in the etching of the capping layer by using the third photosensitive film pattern as the mask, the projection of the capping layer is removed.

12. The method of claim 11, wherein:
after the projection of the capping layer is removed, the end of the capping layer is inwardly recessed as compared to the end of the data wire layer.

13. The method of claim 12, wherein:
the end of the capping layer is removed by a drying etching method.

14. The method of claim 13, wherein:
the dry etching method uses gas including argon (Ar).

15. The method of claim 9, wherein:
the capping layer includes metal oxide.

16. The method of claim 15, wherein:
the capping layer includes indium-zinc oxide.

17. The method of claim 9, further comprising:
removing the third photosensitive film pattern; and
forming a passivation layer on the capping layer and the data wire layer.

18. The method of claim 9, further comprising:
forming a barrier material layer between the semiconductor material layer and the data wire material layer,
wherein the barrier material layer includes metal oxide.

19. The method of claim 9, wherein:
in the etching of the semiconductor material layer to form the semiconductor layer and the etching of the capping layer by using the third photosensitive film pattern as the third mask, a dent portion is formed in the semiconductor layer.

20. The method of claim 19, wherein:
the dent portion of the semiconductor layer is formed in an area corresponding to a channel region.

* * * * *